(12) United States Patent
Kim et al.

(10) Patent No.: US 10,511,268 B2
(45) Date of Patent: Dec. 17, 2019

(54) SEGMENTED THERMAL AND RF GROUND

(71) Applicant: QUALCOMM Incorporated, San Diego, CA (US)

(72) Inventors: Daeik Daniel Kim, Del Mar, CA (US); Manuel Aldrete, Encinitas, CA (US); Bonhoon Koo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 343 days.

(21) Appl. No.: 15/636,626

(22) Filed: Jun. 28, 2017

(65) Prior Publication Data

US 2019/0006999 A1    Jan. 3, 2019

(51) Int. Cl.
| | |
|---|---|
| *H02H 3/00* | (2006.01) |
| *H03F 1/30* | (2006.01) |
| *H01L 23/66* | (2006.01) |
| *H04B 1/04* | (2006.01) |

(52) U.S. Cl.
CPC ............... *H03F 1/30* (2013.01); *H01L 23/66* (2013.01); *H01L 2223/6677* (2013.01); *H03F 2200/186* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 6,300,827 B1 * | 10/2001 | King | ........................ H03F 1/48 330/292 |
| 7,348,842 B2 | 3/2008 | Ichitsubo et al. | |
| 7,477,108 B2 | 1/2009 | Ichitsubo et al. | |
| 8,189,306 B2 | 5/2012 | Jacobson et al. | |
| 8,773,204 B2 | 7/2014 | Cabanillas et al. | |
| 9,379,764 B2 | 6/2016 | Conta et al. | |
| 2016/0093578 A1 * | 3/2016 | Penunuri | ................. H01L 25/16 455/73 |

* cited by examiner

*Primary Examiner* — Stephen W Jackson
(74) *Attorney, Agent, or Firm* — Holland & Hart LLP/Qualcomm (57) ABSTRACT

An exemplary improved ground for a power amplifier circuit may include structural separation of the drive amplifier and the power amplifier grounds and cut-off of the power amplifier induced feedback current to ensure stability under a wide-range of operating conditions. The exemplary power amplifier may include a first ground coupled to a first amplifier circuit, a second ground coupled to a second amplifier circuit separate from the first ground, and the first amplifier circuit generates a drive current for the second amplifier circuit.

30 Claims, 6 Drawing Sheets

SEGMENTED THERMAL AND RF GROUND

FIELD OF DISCLOSURE

This disclosure relates generally to grounds, and more specifically, but not exclusively, to thermal and radio frequency (RF) grounds.

BACKGROUND

The use of wireless devices is becoming more widespread as the benefits of such devices continue to increase along with advances in technology for such devices. Wireless devices use antennas to connect to other devices or networks during operation. These antennas generally require a power amplifier circuit for the transmission and reception of signals. Power amplifier circuits are generally well known in the art, see for example U.S. Patent Publication No. 20130043946 assigned to Qualcomm and incorporated herein by reference. The power amplifier circuits or modules are connected to a power supply and a ground within the wireless device. However, due to the nature of the signals coupled between the power amplifier circuit and the antenna, the power amplifier circuits are subject to various drawbacks. For example, in a high-gain GaAs power amplifier die, the die suffers from instability under various stress and output impedance conditions resulting in yield-dependency issues, significant post-manufacturing debugging, and high return costs. One problem is that a strong power amplifier (PA, $2^{nd}$-stage amplifier in GaAs die) current can affect the driving amplifier (DA, $1^{st}$ amplifier inside PA die) ground when the PA and DA share the same radio frequency (RF) ground. The current feedback in the RF ground forms a positive feedback current between the DA and the PA to create an uncontrolled oscillation in the drive current.

Accordingly, there is a need for systems, apparatus, and methods that overcome the deficiencies of conventional approaches including the methods, system and apparatus provided hereby that includes a structural separation of the DA and the PA grounds and cut-off of the PA-induced feedback current to ensure stability under a wide-range of operating conditions.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a power amplifier comprises: a first ground coupled to a first amplifier circuit; a second ground coupled to a second amplifier circuit, the second ground separate from the first ground; and wherein the first amplifier circuit is configured to generate a drive current for the second amplifier circuit.

In another aspect, a power amplifier comprises: a first means for providing a return path for a current coupled to a first amplifier circuit; a second means for providing a return path for a current coupled to a second amplifier circuit, the second means for providing a return path for a current separate from the first means for providing a return path for a current; and wherein the first amplifier circuit is configured to generate a drive current for the second amplifier circuit.

In still another aspect, an antenna module comprises: a first ground coupled to a first amplifier circuit; a second ground coupled to a second amplifier circuit, the second ground separate from the first ground; an antenna coupled to the second amplifier circuit, the second amplifier circuit configured to amplify a signal from the antenna; and wherein the first amplifier circuit is configured to generate a drive current for the second amplifier circuit.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Some examples may physically isolate a strong PA current path and DA current path by providing separate RF grounds for the DA and the PA. By doing so, some examples herein reduce the feedback current to DA from PA, and therefore stabilize the whole PA circuit under stress and a wide-range of external impedances. As the stability is achieved with the given structure, oscillation prevention components may be reduced in the PA module thus reducing the component area and cost of the PA module. Separate DA and PA thermal and RF grounds provide a physical separation of possible feedback paths between the DA and the PA and allow designers to ignore the back-side Au and conductive epoxy current by using the separation and aspect ratio between DA and PA ground. This may result in a cut off of the major PA current feedback effect from DA ground and expands the whole PA module stable-operation range.

Figure 1:
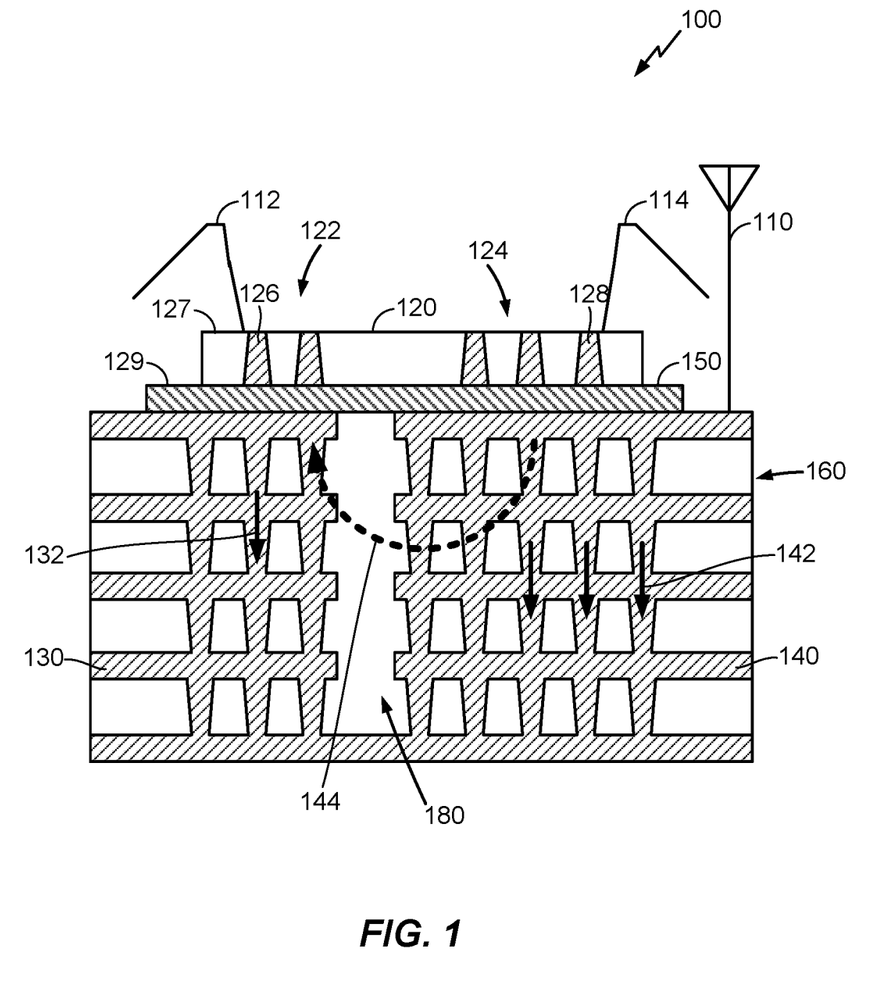
FIG. 1 illustrates an exemplary power amplifier with an antenna in accordance with some examples of the disclosure.

FIG. 1 illustrates an exemplary power amplifier with an antenna in accordance with some examples of the disclosure. As shown in FIG. 1, a power amplifier module 100 may include an antenna 110, wire bonds 112 and 114, a power amplifier die 120 (e.g. GaAs or similar semiconductor material), a first ground 130, and a second ground 140. The antenna 110 may be optional since the power amplifier module 100 may be used in other applications. The antenna 110 may be coupled to the power amplifier die 120 with output blocks, such as duplexer, switch, filter, and/or redistribution layers such that the signals received and transmitted by the antenna 110 may be coupled to the power amplifier die 120 for amplification and filtering. Wire bonds 112 and 114 may be included to provide additional connection paths between the power amplifier die 120 and other circuits or components. The power amplifier die 120 may include a first amplifier circuit 122, a second amplifier circuit 124, a first plurality of vias 126 from an active side 127 of the power amplifier die 120 to a back side 129 of the power amplifier die 120, and a second plurality of vias 128 from the active side 127 of the power amplifier die 120 to the back side 129 of the power amplifier die 120. The active side 127 is the part of the power amplifier die 120 that contains the active components of the power amplifier die 120 (e.g. transistors, resistors, capacitors, inductors, etc.), which perform the operation or function of the power amplifier die 120. The first amplifier circuit 122 may be configured as a first stage of the power amplifier die 120 and provide a drive current to the second amplifier circuit 124. The second amplifier circuit 124 may be configured as a second stage of the power amplifier die 120. Together, the first amplifier circuit 122 and the second amplifier circuit 124 are configured to amplify signals to and from the antenna 110.

The power amplifier module 100 may include a conductive epoxy 150 to bond the power amplifier die 120 to a substrate 160 (e.g. organic, silicon, silicon dioxide, aluminum oxide, sapphire, germanium, gallium arsenide, an alloy of silicon and germanium, or indium phosphide). The substrate 160 may include the first ground 130 and the second ground 140 embedded therein. The first ground 130 may be coupled to the first amplifier circuit 122 and configured to allow a first amplifier circuit current 132 to circulate therein. The second ground 140 may be coupled to the second amplifier circuit 124 and configured to allow a second amplifier circuit current 142 to circulate therein. The first ground 130 is separate from the second ground 140 (e.g. having a gap 180 there between) such that a feedback current 144 from the second amplifier circuit 124 is isolated from the first amplifier circuit 122. The first ground 130 and the second ground 140 may be composed of conductive material, such as copper, that allows current to circulate as well as provide thermal dissipation of any heat generated by the power amplifier die 120. The first ground 130 and the second ground 140 may be configured as a plurality of vias and horizontal traces, respectively, to form a segmented lattice structure as shown or other similar structures. The first ground 130 and the second ground 140 may be coupled to a ground potential, such as a system ground for the power amplifier die 120 or a ground for a printed circuit board, for example.

Figure 2:
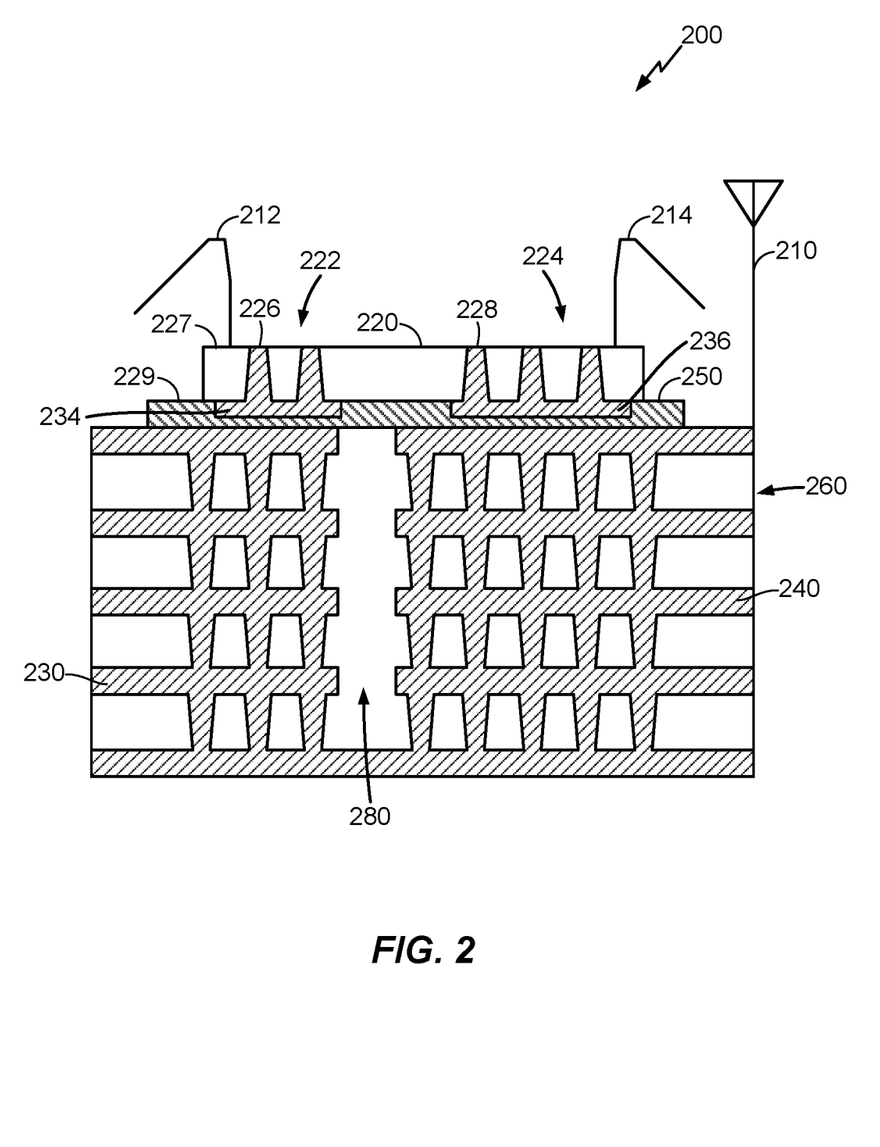
FIG. 2 illustrates an exemplary power amplifier with an antenna and patterned back side in accordance with some examples of the disclosure.

FIG. 2 illustrates an exemplary power amplifier with an antenna and patterned back side in accordance with some examples of the disclosure. As shown in FIG. 2, a power amplifier module 200 (e.g. power amplifier module 100) may include an antenna 210, wire bonds 212 and 214, a power amplifier die 220 (e.g. GaAs or similar semiconductor material), a first ground 230, and a second ground 240. The antenna 210 may be optional since the power amplifier module 200 may be used in other applications. The antenna 210 may be coupled to the power amplifier die 220 with output blocks, such as duplexer, switch, filter, and/or redistribution layers such that the signals received and transmitted by the antenna 210 may be coupled to the power amplifier die 220 for amplification and filtering. Wire bonds 212 and 214 may be included to provide additional connection paths between the power amplifier die 220 and other circuits or components. The power amplifier die 220 may include a first amplifier circuit 222, a second amplifier circuit 224, a first plurality of vias 226 from an active side 227 of the power amplifier die 220 to a back side 229 of the power amplifier die 220, and a second plurality of vias 228 from the active side 227 of the power amplifier die 220 to the back side 229 of the power amplifier die 220. The active side 227 is the part of the power amplifier die 220 that contains the active components of the power amplifier die 220 (e.g. transistors, resistors, capacitors, inductors, etc.), which perform the operation or function of the power amplifier die 220. The power amplifier module 200 may include a first trace 234 on the back side of the power amplifier die 220 coupled to the first plurality of vias 226 and a second trace 236 on the back side of the power amplifier die 220 coupled to the second plurality of vias 228 such that the first trace 234 and the second trace 236 aid in physically separating the first ground 230 from the second ground 240. The first trace 234 and the second trace 236 may be patterned and composed of gold or other suitable material. The first amplifier circuit 222 may be configured as a first stage of the power amplifier die 220 and provide a drive current to the second amplifier circuit 224. The second amplifier circuit 224 may be configured as a second stage of the power amplifier die 220. Together, the first amplifier circuit 222 and the second amplifier circuit 224 are configured to amplify signals to and from the antenna 210.

The power amplifier module 200 may include a conductive epoxy 250 to bond the power amplifier die 220 to a substrate 260 (e.g. organic, silicon, silicon dioxide, aluminum oxide, sapphire, germanium, gallium arsenide, an alloy of silicon and germanium, or indium phosphide). The substrate 260 may include the first ground 230 and the second ground 240 embedded therein. The first ground 230 may be coupled to the first amplifier circuit 222 through the first trace 234 and configured to allow a first amplifier circuit current to circulate therein. The second ground 240 may be coupled to the second amplifier circuit 224 through the second trace 236 and configured to allow a second amplifier circuit current to circulate therein. The first ground 230 is separate from the second ground 240 (e.g. having a gap 280 there between) such that a feedback current from the second amplifier circuit 224 is isolated from the first amplifier circuit 222. The first ground 230 and the second ground 240 may be composed of conductive material, such as copper, that allows current to circulate as well as provide thermal dissipation of any heat generated by the power amplifier die 220. The first ground 230 and the second ground 240 may be configured as a plurality of vias and horizontal traces, respectively, to form a segmented lattice structure as shown or other similar structures. The first ground 230 and the second ground 240 may be coupled to a ground potential, such as a system ground for the power amplifier die 220 or a ground for a printed circuit board, for example.

Figure 3:
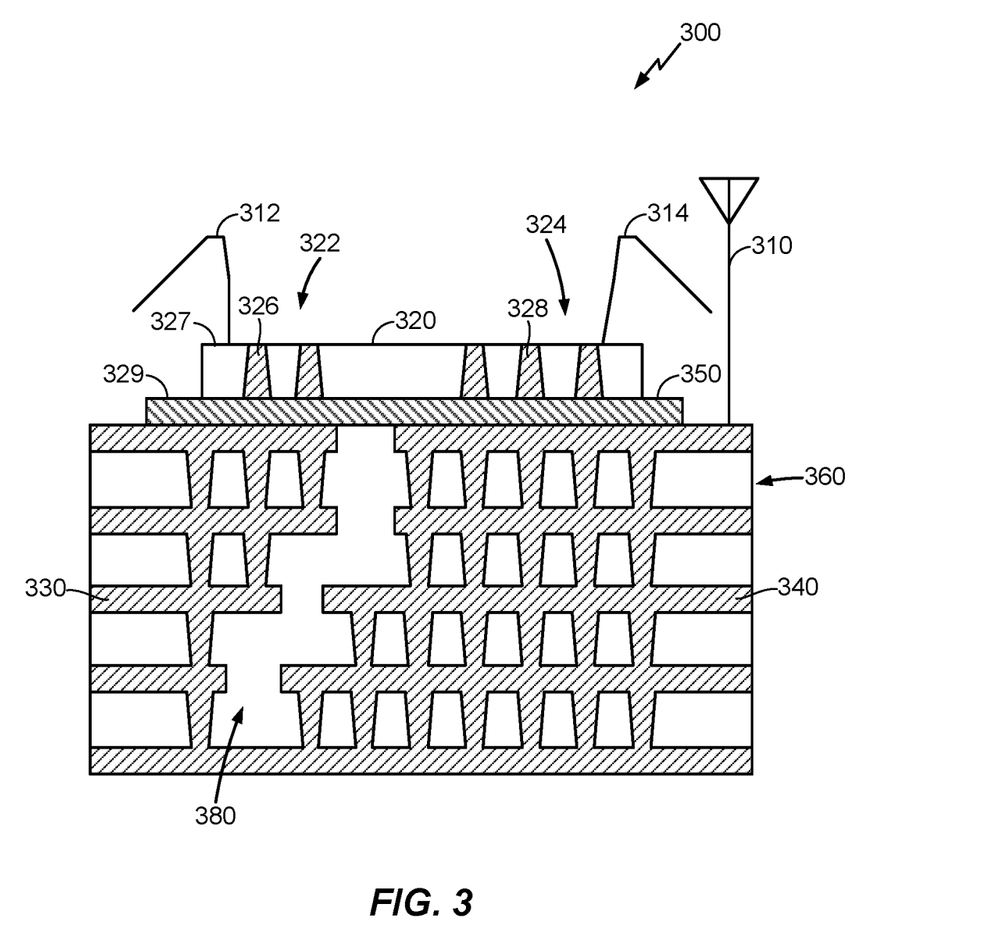
FIG. 3 illustrates an exemplary power amplifier with an antenna and a staggered segmented ground in accordance with some examples of the disclosure.

FIG. 3 illustrates an exemplary power amplifier with an antenna and a staggered segmented ground in accordance with some examples of the disclosure. As shown in FIG. 3, a power amplifier module 300 (e.g. power amplifier module 100 and power amplifier module 200) may include an antenna 310, wire bonds 312 and 314, a power amplifier die 320 (e.g. GaAs or similar semiconductor material), a first ground 330, and a second ground 340. The antenna 310 may be optional since the power amplifier module 300 may be used in other applications. The antenna 310 may be coupled to the power amplifier die 320 with output blocks, such as duplexer, switch, filter, and/or redistribution layers such that the signals received and transmitted by the antenna 310 may be coupled to the power amplifier die 320 for amplification and filtering. Wire bonds 312 and 314 may be included to provide additional connection paths between the power amplifier die 320 and other circuits or components. The power amplifier die 320 may include a first amplifier circuit 322, a second amplifier circuit 324, a first plurality of vias 326 from an active side 327 of the power amplifier die 320 to a back side 329 of the power amplifier die 320, and a second plurality of vias 328 from the active side 327 of the power amplifier die 320 to the back side 329 of the power amplifier die 320. The active side 327 is the part of the power amplifier die 320 that contains the active components of the power amplifier die 320 (e.g. transistors, resistors, capacitors, inductors, etc.), which perform the operation or function of the power amplifier die 320. The first amplifier circuit 322 may be configured as a first stage of the power amplifier die 320 and provide a drive current to the second amplifier circuit 324. The second amplifier circuit 324 may be configured as a second stage of the power amplifier die 320. Together, the first amplifier circuit 322 and the second amplifier circuit 324 are configured to amplify signals to and from the antenna 310.

The power amplifier module 300 may include a conductive epoxy 350 to bond the power amplifier die 320 to a substrate 360 (e.g. organic, silicon, silicon dioxide, aluminum oxide, sapphire, germanium, gallium arsenide, an alloy of silicon and germanium, or indium phosphide). The substrate 360 may include the first ground 330 and the second ground 340 embedded therein. The first ground 330 may be coupled to the first amplifier circuit 322 and configured to allow a first amplifier circuit current to circulate therein. The second ground 340 may be coupled to the second amplifier circuit 324 and configured to allow a second amplifier circuit current to circulate therein. The first ground 330 is separate from the second ground 340 (e.g. having a gap 380 there between) such that a feedback current from the second amplifier circuit 324 is isolated from the first amplifier circuit 322. The gap 380 may be configured as a staggered stair like structure such the first ground 330 is segmented and staggered and the second ground 340 is segmented and staggered complementary to the first ground 330. The first ground 330 and the second ground 340 may be composed of conductive material, such as copper, that allows current to circulate as well as provide thermal dissipation of any heat generated by the power amplifier die 320. The first ground 330 and the second ground 340 may be configured as a plurality of vias and horizontal traces, respectively, to form a segmented lattice structure as shown or other similar structures. The first ground 330 and the second ground 340 may be coupled to a ground potential, such as a system ground for the power amplifier die 320 or a ground for a printed circuit board, for example.

Figure 4:
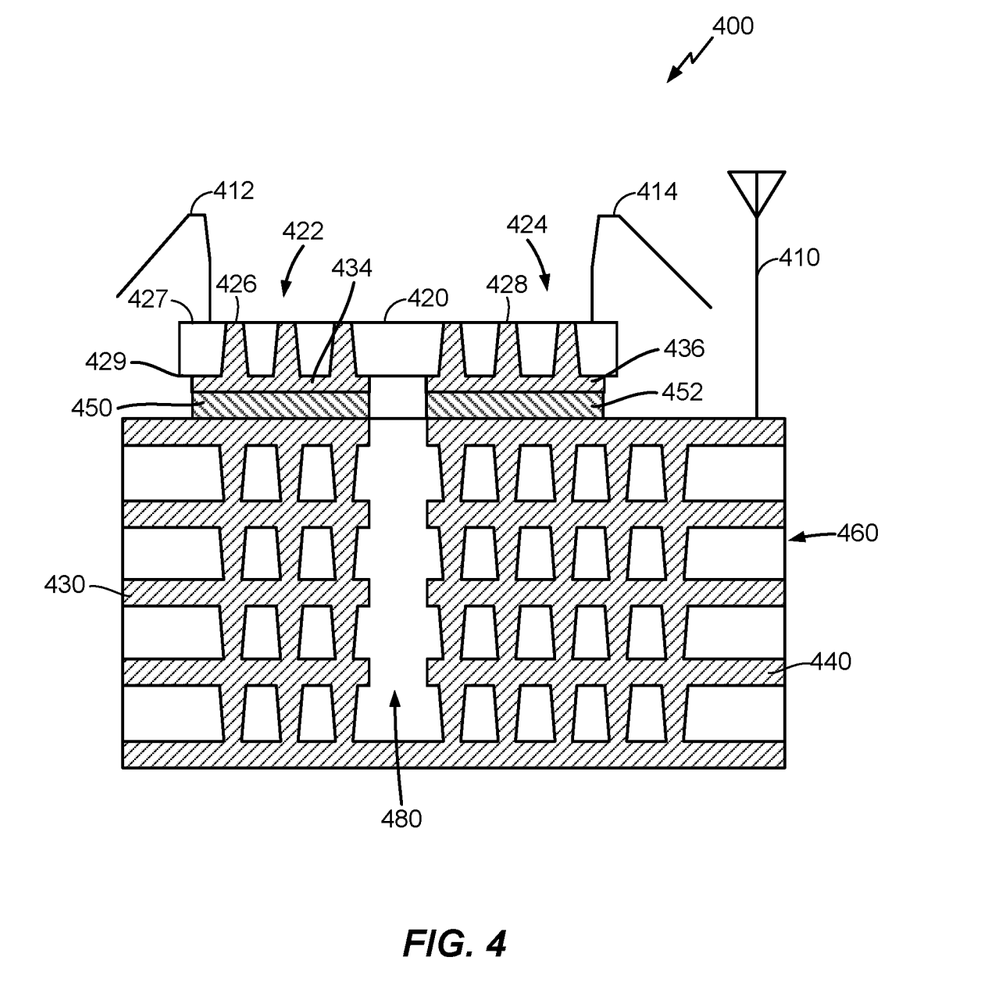
FIG. 4 illustrates an exemplary power amplifier with an antenna and solder pattern in accordance with some examples of the disclosure.

FIG. 4 illustrates an exemplary power amplifier with an antenna and solder pattern in accordance with some examples of the disclosure. As shown in FIG. 4, a power amplifier module 400 (e.g. power amplifier module 100, power amplifier module 200, and power amplifier module 300) may include an antenna 410, wire bonds 412 and 414, a power amplifier die 420 (e.g. GaAs or similar semiconductor material), a first ground 430, and a second ground 440. The antenna 410 may be optional since the power amplifier module 400 may be used in other applications. The antenna 410 may be coupled to the power amplifier die 420 with output blocks, such as duplexer, switch, filter, and/or redistribution layers such that the signals received and transmitted by the antenna 410 may be coupled to the power amplifier die 420 for amplification and filtering. Wire bonds 412 and 414 may be included to provide additional connection paths between the power amplifier die 420 and other circuits or components. The power amplifier die 420 may include a first amplifier circuit 422, a second amplifier circuit 424, a first plurality of vias 426 from an active side 427 of the power amplifier die 420 to a back side 429 of the power amplifier die 420, and a second plurality of vias 428 from the active side 427 of the power amplifier die 420 to the back side 429 of the power amplifier die 420. The active side 427 is the part of the power amplifier die 420 that contains the active components of the power amplifier die 420 (e.g. transistors, resistors, capacitors, inductors, etc.), which perform the operation or function of the power amplifier die 420. The first amplifier circuit 422 may be configured as a first stage of the power amplifier die 420 and provide a drive current to the second amplifier circuit 424. The second amplifier circuit 424 may be configured as a second stage of the power amplifier die 420. Together, the first amplifier circuit 422 and the second amplifier circuit 424 are configured to amplify signals to and from the antenna 410.

The power amplifier module 400 may include a first land grid array to connect the first amplifier circuit 422 to a substrate 460 (e.g. organic, silicon, silicon dioxide, aluminum oxide, sapphire, germanium, gallium arsenide, an alloy of silicon and germanium, or indium phosphide) and a second land grid array to connect the second amplifier circuit 424 to the substrate 460. The first land grid array may include a first solder base 450 directly connected to the substrate 460 and a first trace 434 on the back side of the power amplifier die 420 coupled to the first plurality of vias 426. The second land grid array may include a second solder base 452 directly connected to the substrate 460 and a second trace 436 on the back side of the power amplifier die 420 coupled to the second plurality of vias 428 such that the first land grid array and the second land grid array aid in physically separating the first ground 430 from the second ground 440. The first trace 434 and the second trace 436 may be patterned and composed of gold or other suitable material. The substrate 460 may include the first ground 430 and the second ground 440 embedded therein. The first ground 430 may be coupled to the first amplifier circuit 422 and configured to allow a first amplifier circuit current to circulate therein. The second ground 440 may be coupled to the second amplifier circuit 424 and configured to allow a second amplifier circuit current to circulate therein. The first ground 430 is separate from the second ground 440 (e.g.

having a gap 480 there between) such that a feedback current from the second amplifier circuit 424 is isolated from the first amplifier circuit 422. The first ground 430 and the second ground 440 may be composed of conductive material, such as copper, that allows current to circulate as well as provide thermal dissipation of any heat generated by the power amplifier die 420. The first ground 430 and the second ground 440 may be configured as a plurality of vias and horizontal traces, respectively, to form a segmented lattice structure as shown or other similar structures. The first ground 430 and the second ground 440 may be coupled to a ground potential, such as a system ground for the power amplifier die 420 or a ground for a printed circuit board, for example.

Figure 5:
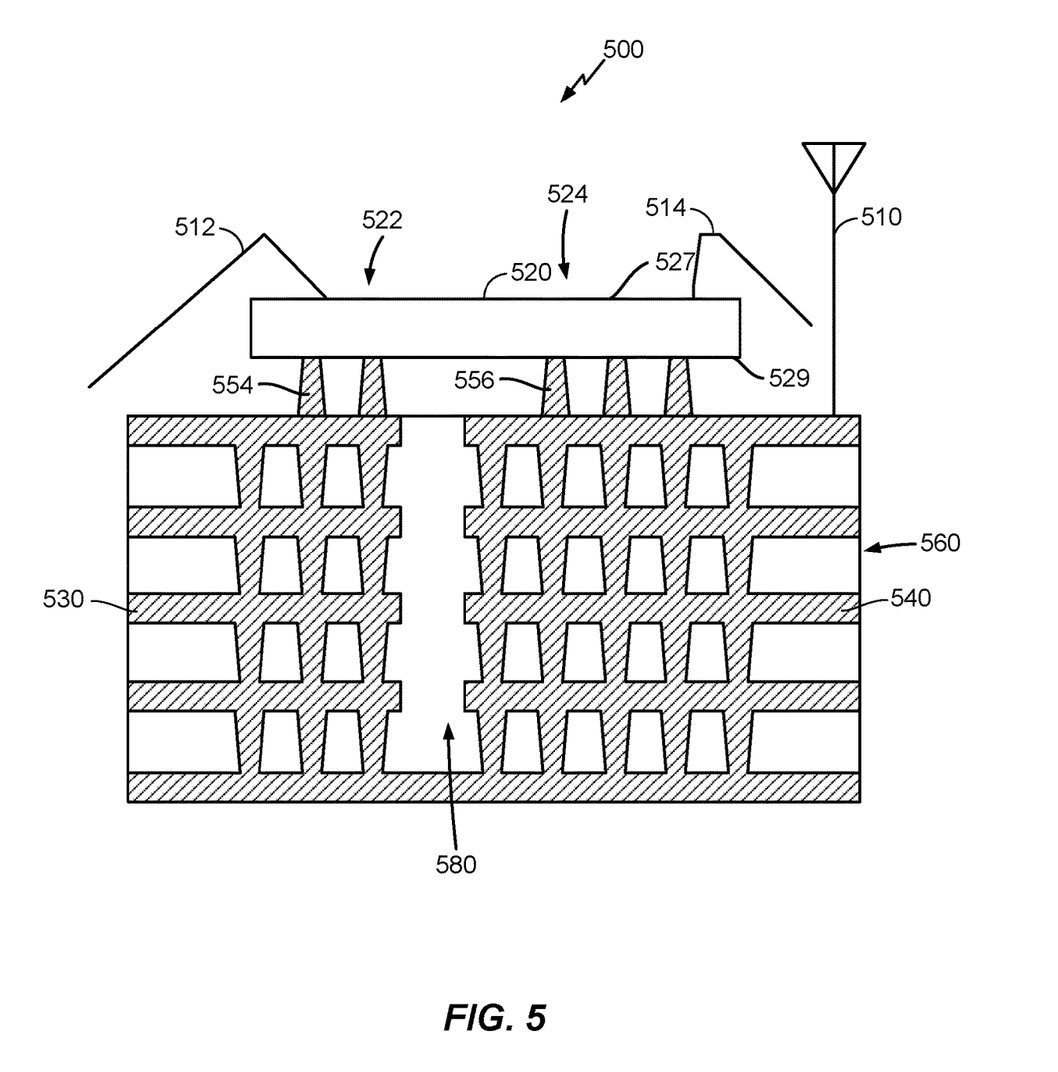
FIG. 5 illustrates an exemplary power amplifier with an antenna and pillar assembly in accordance with some examples of the disclosure.

FIG. 5 illustrates an exemplary power amplifier with an antenna and pillar assembly in accordance with some examples of the disclosure. As shown in FIG. 5, a power amplifier module 500 (e.g. power amplifier module 100, power amplifier module 200, power amplifier module 300, and power amplifier module 400) may include an antenna 510, wire bonds 512 and 514, a power amplifier die 520 (e.g. GaAs or similar semiconductor material), a first ground 530, and a second ground 540. The antenna 510 may be optional since the power amplifier module 500 may be used in other applications. The antenna 510 may be coupled to the power amplifier die 520 with output blocks, such as duplexer, switch, filter, and/or redistribution layers such that the signals received and transmitted by the antenna 510 may be coupled to the power amplifier die 520 for amplification and filtering. Wire bonds 512 and 514 may be included to provide additional connection paths between the power amplifier die 520 and other circuits or components. The power amplifier die 520 may include a first amplifier circuit 522, a second amplifier circuit 524, an active side 527 of the power amplifier die 520, and a back side 529 of the power amplifier die 520. The active side 527 is the part of the power amplifier die 520 that contains the active components of the power amplifier die 520 (e.g. transistors, resistors, capacitors, inductors, etc.), which perform the operation or function of the power amplifier die 520. The first amplifier circuit 522 may be configured as a first stage of the power amplifier die 520 and provide a drive current to the second amplifier circuit 524. The second amplifier circuit 524 may be configured as a second stage of the power amplifier die 520. Together, the first amplifier circuit 522 and the second amplifier circuit 524 are configured to amplify signals to and from the antenna 510.

The power amplifier module 500 may include a first plurality of conductive pillars 554 to connect the first amplifier circuit 522 to a substrate 560 (e.g. organic, silicon, silicon dioxide, aluminum oxide, sapphire, germanium, gallium arsenide, an alloy of silicon and germanium, or indium phosphide) and a second plurality of conductive pillars 556 to connect the second amplifier circuit 524 to the substrate 560. The substrate 560 may include the first ground 530 and the second ground 540 embedded therein. The first ground 530 may be coupled to the first amplifier circuit 522 and configured to allow a first amplifier circuit current to circulate therein. The second ground 540 may be coupled to the second amplifier circuit 524 and configured to allow a second amplifier circuit current to circulate therein. The first ground 530 is separate from the second ground 540 (e.g. having a gap 580 there between) such that a feedback current from the second amplifier circuit 524 is isolated from the first amplifier circuit 522. The first ground 530 and the second ground 540 may be composed of conductive material, such as copper, that allows current to circulate as well as provide thermal dissipation of any heat generated by the power amplifier die 520. The first ground 530 and the second ground 540 may be configured as a plurality of vias and horizontal traces, respectively, to form a segmented lattice structure as shown or other similar structures. The first ground 530 and the second ground 540 may be coupled to a ground potential, such as a system ground for the power amplifier die 520 or a ground for a printed circuit board, for example.

It will be appreciated that various aspects disclosed herein can be described as functional equivalents to the structures, materials and/or devices described and/or recognized by those skilled in the art. For example, in one aspect an apparatus, such as a power amplifier or antenna module, may comprise a first means for providing a return path for a current (e.g. first ground structure 130 in FIG. 1, first ground structure 230 in FIG. 2, first ground structure 330 in FIG. 3, first ground structure 430 in FIG. 4, and first ground structure 530 in FIG. 5) coupled to a first amplifier circuit (e.g. first amplifier circuit 122 in FIG. 1, first amplifier circuit 222 in FIG. 2, first amplifier circuit 322 in FIG. 3, first amplifier circuit 422 in FIG. 4, and first amplifier circuit 522 in FIG. 5); a second means for providing a return path for a current (e.g. second ground structure 140 in FIG. 1, second ground structure 240 in FIG. 2, second ground structure 340 in FIG. 3, second ground structure 440 in FIG. 4, and second ground structure 540 in FIG. 5) coupled to a second amplifier circuit (e.g. second amplifier circuit 124 in FIG. 1, second amplifier circuit 224 in FIG. 2, second amplifier circuit 324 in FIG. 3, second amplifier circuit 424 in FIG. 4, and second amplifier circuit 524 in FIG. 5), the second means for providing a return path for a current separate from the first means for providing a return path for a current; and wherein the first amplifier circuit is configured to generate a drive current for the second amplifier circuit. It will be appreciated that the aforementioned aspects are merely provided as examples and the various aspects claimed are not limited to the specific references and/or illustrations cited as examples.

Figure 6:
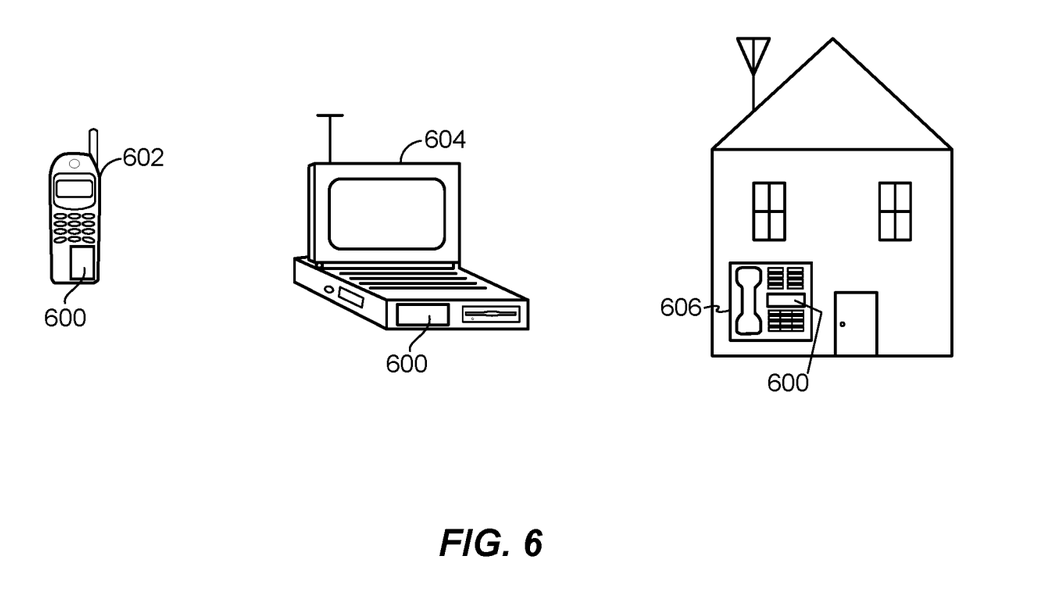
FIG. 6 illustrates various electronic devices that may be integrated with any of the aforementioned integrated device, semiconductor device, integrated circuit, die, or amplifier in accordance with some examples of the disclosure.

FIG. 6 illustrates various electronic devices that may be integrated with any of the aforementioned integrated device, semiconductor device, integrated circuit, die, antenna modules or power amplifier in accordance with some examples of the disclosure. For example, a mobile phone device 602, a laptop computer device 604, and a fixed location terminal device 606 may include an integrated device 600 as described herein. The integrated device 600 may be, for example, any of the integrated circuits, dies, integrated devices, integrated device packages, integrated circuit devices, device packages, integrated circuit (IC) packages, antenna modules or power amplifiers described herein. The devices 602, 604, 606 illustrated in FIG. 6 are merely exemplary. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

One or more of the components, processes, features, and/or functions illustrated in FIGS. 1-6 may be rearranged and/or combined into a single component, process, feature or function or incorporated in several components, processes, or functions. Additional elements, components, processes, and/or functions may also be added without departing from the disclosure. It should also be noted that FIGS. 1-6 and its corresponding description in the present disclosure is not limited to dies and/or ICs. In some implementations, FIGS. 1-6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, antenna module, or power amplifier.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A power amplifier comprising:
a first ground coupled to a first amplifier circuit, wherein the first ground is segmented; and
a second ground coupled to a second amplifier circuit, wherein the second ground is separate from the first ground, and
wherein the first amplifier circuit is configured to generate a drive current for the second amplifier circuit.

2. The power amplifier of claim 1, further comprising a first trace on a back side of a power amplifier die, wherein the first trace is configured to couple the first amplifier circuit to the first ground.

3. The power amplifier of claim 2, further comprising a second trace on the back side of the power amplifier die, wherein the second trace is configured to couple the second amplifier circuit to the second ground.

4. The power amplifier of claim 1, wherein the first ground is staggered and the second ground is segmented and staggered complementary to the first ground.

5. The power amplifier of claim 1, further comprising a first land grid array on a back side of a power amplifier die, wherein the first land grid array is configured to couple the first amplifier circuit to the first ground.

6. The power amplifier of claim 5, further comprising a second land grid array on the back side of the power amplifier die, wherein the second land grid array is configured to couple the second amplifier circuit to the second ground.

7. The power amplifier of claim 1, further comprising a first plurality of copper pillars extending from a back side of a power amplifier die to the first ground.

8. The power amplifier of claim 7, further comprising a second plurality of copper pillars extending from the back side of the power amplifier die to the second ground.

9. The power amplifier of claim 8, further comprising a substrate proximate to the power amplifier die, wherein the first ground and the second ground are embedded in the substrate.

10. The power amplifier of claim 1, wherein the power amplifier is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A power amplifier comprising:
a first means for providing a return path for a current coupled to a first amplifier circuit, wherein the first means for providing a return path for a current is segmented; and
a second means for providing a return path for a current coupled to a second amplifier circuit, wherein the second means for providing a return path for a current is separate from the first means for providing a return path for a current, and
wherein the first amplifier circuit is configured to generate a drive current for the second amplifier circuit.

12. The power amplifier of claim 11, further comprising a first trace on a back side of a power amplifier die, wherein the first trace is configured to couple the first amplifier circuit to the first means for providing a return path for a current.

13. The power amplifier of claim 12, further comprising a second trace on the back side of the power amplifier die, wherein the second trace is configured to couple the second amplifier circuit to the second means for providing a return path for a current.

14. The power amplifier of claim 11, wherein the first means for providing a return path for a current is staggered and the second means for providing a return path for a current is segmented and staggered complementary to the first means for providing a return path for a current.

15. The power amplifier of claim 11, further comprising a first land grid array on a back side of a power amplifier die, wherein the first land grid array is configured to couple the first amplifier circuit to the first means for providing a return path for a current.

16. The power amplifier of claim 15, further comprising a second land grid array on the back side of the power amplifier die, wherein the second land grid array is configured to couple the second amplifier circuit to the second means for providing a return path for a current.

17. The power amplifier of claim 11, further comprising a first plurality of copper pillars extending from a back side of a power amplifier die to the first means for providing a return path for a current.

18. The power amplifier of claim 17, further comprising a second plurality of copper pillars extending from the back side of the power amplifier die to the second means for providing a return path for a current.

19. The power amplifier of claim 18, further comprising a substrate proximate to the power amplifier die, wherein the first means for providing a return path for a current and the second means for providing a return path for a current are embedded in the substrate.

20. The power amplifier of claim 11, wherein the power amplifier is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. An antenna module comprising:
a first ground coupled to a first amplifier circuit;
a second ground coupled to a second amplifier circuit, wherein the second ground is separate from the first ground; and an antenna coupled to the second amplifier circuit, wherein the second amplifier circuit is configured to amplify a signal from the antenna, and wherein the first amplifier circuit is configured to generate a drive current for the second amplifier circuit.

22. The antenna module of claim 21, further comprising a first trace on a back side of a power amplifier die, wherein the power amplifier die comprises the first amplifier circuit and the second amplifier circuit, and wherein the first trace is configured to couple the first amplifier circuit to the first ground.

23. The antenna module of claim 22, further comprising a second trace on the back side of the power amplifier die, wherein the second trace is configured to couple the second amplifier circuit to the second ground.

24. The antenna module of claim 21, wherein the first ground is segmented and staggered and the second ground is segmented and staggered complementary to the first ground.

25. The antenna module of claim 21, further comprising a first land grid array on a back side of a power amplifier die, wherein the power amplifier die comprises the first amplifier circuit and the second amplifier circuit, and wherein the first land grid array is configured to couple the first amplifier circuit to the first ground.

26. The antenna module of claim 25, further comprising a second land grid array on the back side of the power amplifier die, wherein the second land grid array is configured to couple the second amplifier circuit to the second ground.

27. The antenna module of claim 21, further comprising a first plurality of copper pillars extending from a back side of a power amplifier die to the first ground, wherein the power amplifier die comprises the first amplifier circuit and the second amplifier circuit.

28. The antenna module of claim 27, further comprising a second plurality of copper pillars extending from the back side of the power amplifier die to the second ground.

29. The antenna module of claim 28, further comprising a substrate proximate to the power amplifier die, wherein the first ground and the second ground are embedded in the substrate.

30. The antenna module of claim 21, wherein the antenna module is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *